(12) United States Patent
Wu et al.

(10) Patent No.: US 10,205,131 B2
(45) Date of Patent: Feb. 12, 2019

(54) MASK GROUP AND METHOD FOR FABRICATING AN ORGANIC LUMINESCENCE LAYER, DISPLAY PANEL AND DRIVING METHOD

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Haidong Wu, Beijing (CN); Weilin Lai, Beijing (CN); Juanjuan Bai, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 204 days.

(21) Appl. No.: 15/129,626

(22) PCT Filed: Jan. 14, 2016

(86) PCT No.: PCT/CN2016/070873
§ 371 (c)(1),
(2) Date: Sep. 27, 2016

(87) PCT Pub. No.: WO2017/016201
PCT Pub. Date: Feb. 2, 2017

(65) Prior Publication Data
US 2017/0179442 A1    Jun. 22, 2017
US 2017/0365821 A9    Dec. 21, 2017

(30) Foreign Application Priority Data

Jul. 27, 2015  (CN) .......................... 2015 1 0446792

(51) Int. Cl.
*H01L 51/56*        (2006.01)
*H01L 27/32*        (2006.01)
*H01L 51/00*        (2006.01)

(52) U.S. Cl.
CPC .............. *H01L 51/56* (2013.01); *H01L 27/32* (2013.01); *H01L 27/3213* (2013.01); *H01L 51/0011* (2013.01); *H01L 2251/56* (2013.01)

(58) Field of Classification Search
CPC .......... H01L 21/56; H01L 27/32; H01L 51/56
See application file for complete search history.

(56) References Cited

U.S. PATENT DOCUMENTS

2009/0121983 A1* 5/2009 Sung ................... H01L 27/3216
345/76
2015/0070374 A1    3/2015 Gong

FOREIGN PATENT DOCUMENTS

CN    101175349 B    8/2011
CN    102428756      4/2012
(Continued)

OTHER PUBLICATIONS

International Search Report for International Application No. PCT/CN2016/070873, dated May 13, 2016 (22 pages).
(Continued)

*Primary Examiner* — Errol Fernandes
(74) *Attorney, Agent, or Firm* — Armstrong Teasdale LLP (57) ABSTRACT

The disclosure provides a mask plate assembly, a method for fabricating an electroluminescent layer, a display panel and a method for driving the same. The mask plate assembly includes a first color mask plate, a second color mask plate, and a third color mask plate each having a plurality of rectangular openings. First openings of the first color mask plate and second openings of the second color mask plate are of a length in a row direction, which is substantially twice as that of third openings of the third color mask plate in the (Continued)

row direction. When the respective mask plates are aligned with one another, the first openings, the second openings, and the third openings are arranged alternately in an order of a first opening, a third opening, a second opening, and another third opening.

11 Claims, 6 Drawing Sheets

(56) References Cited

FOREIGN PATENT DOCUMENTS

| CN | 103280162 A | 9/2013 |
|---|---|---|
| CN | 103484818 A | 1/2014 |
| CN | 103887445 A | 6/2014 |
| CN | 104347663 A | 2/2015 |
| CN | 105140421 A | 12/2015 |

OTHER PUBLICATIONS

China Office Action, Application No. 201510446792.X, dated Sep. 28, 2016, 11 pps.

* cited by examiner

MASK GROUP AND METHOD FOR FABRICATING AN ORGANIC LUMINESCENCE LAYER, DISPLAY PANEL AND DRIVING METHOD

CROSS REFERENCE TO RELATED APPLICATIONS

This application is a National Stage entry of PCT/CN2016/070873 filed Jan. 14, 2016, which claims priority of Chinese Patent Application No. 201510446792.X, which was filed on Jul. 27, 2015, the disclosures of which are incorporated herein by reference in their entirety.

BACKGROUND

This disclosure relates to the field of display technology, in particular to a mask plate assembly, a method for fabricating an electroluminescent layer, a display panel and a method for driving the same.

An Organic Light-Emitting Diode (OLED) display panel basically includes an anode, a light-emitting layer formed by organic electroluminescent materials, and a cathode.

There are mainly two methods for achieving color displaying of OLED, one of which is to achieve color displaying by using a combination of a white-light organic electroluminescent material and a color filter. However, this method degrades displaying brightness for color displaying, due to the fact that a part of light rays are absorbed by the color filter.

Figure 1:
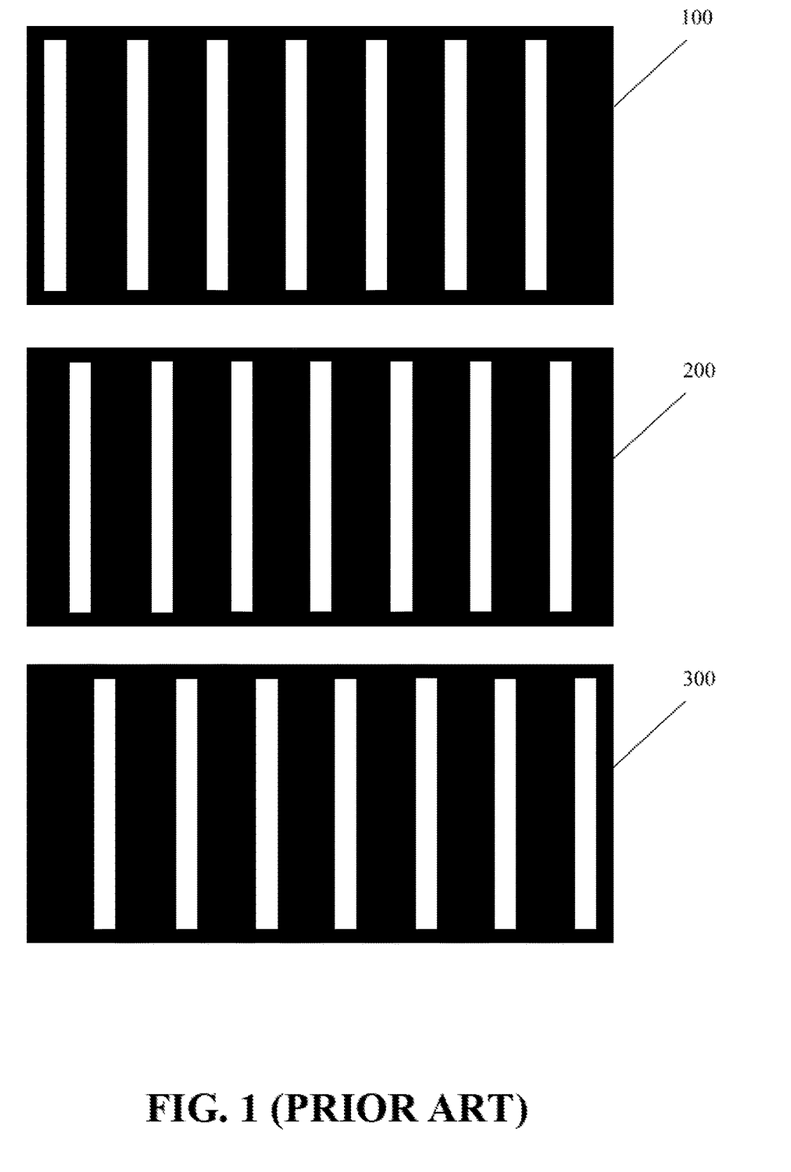
FIG. 1 is a schematic diagram illustrating a structure of a mask plate assembly according to the related arts.

Another method is to form sub-pixels for respective colors by evaporating electroluminescent materials for different primary colors using high precision mask plates. FIG. 1 is a diagram illustrating a conventional mask plate assembly in related arts. As shown in FIG. 1, the mask plate assembly includes three mask plates 100, 200, and 300, each of which is used to form sub-pixels for displaying a corresponding color. Each of mask plates is provided with a plurality of elongated openings, each of which is used to form one column of sub-pixels. In addition, positions for forming openings of respective mask plates are complementary, thereby forming a pixel array having sub-pixels for displaying three colors distributed therein.

Displaying resolution depends on areas of sub-pixels formed by an evaporation process using mask plates. Namely, the higher densely sub-pixels are distributed, the smaller their areas are, which requires that widths of respective openings included in the mask plates should be smaller. Accordingly, within respective mask plates, a width of grids between respective openings (which is twice as that of openings, as shown in FIG. 1) need to be smaller, which may easily result in deform of grids and adverse effect on shapes of sub-pixels to be fabricated.

BRIEF DESCRIPTION

In a first aspect, embodiments of the present disclosure provide a mask plate assembly, which includes a first mask plate having a plurality of first openings, a second mask plate having a plurality of second openings, and a third mask plate having a plurality of third openings. The first openings and the second openings are of a same length in a row direction, which is substantially twice as that of the third openings in the row direction. When the first mask plate, the second mask plate, and the third mask plate are aligned with one another, the first openings, the second openings, and the third openings are arranged alternately in an order of a first opening, a third opening, a second opening, and another third opening.

In one possible embodiment, the first openings and the second openings are of a same length in a column direction, and the first openings and the second openings are aligned with one another in the column direction and arranged alternately.

In one possible embodiment, the third mask plate includes a first sub-mask plate having a plurality of the third openings and a second sub-mask plate having a plurality of the third openings. When the first sub-mask plate and the second sub-mask plate are aligned with one another, the third openings of the first sub-mask plate and the third openings of the second sub-mask plate are arranged alternately in the row direction.

In one possible embodiment, the first openings, the second openings, and the third openings are all of a rectangular shape, and the first mask plate, and/or the second mask plate, and/or the third mask plate is(are) a metal mask plate.

In a second aspect, embodiments of the present disclosure provide a method for fabricating a display panel component by using any one of the above mask plate assemblies. The method includes fabricating a first layer by using the first mask plate, fabricating a second layer by using the second mask plate, and fabricating a third layer by using the third mask plate.

In one possible embodiment, the first layer is a first electroluminescent layer for displaying a first color, the second layer is a second electroluminescent layer for displaying a second color, and the third layer is a third electroluminescent layer for displaying a third color.

In one possible embodiment, each of the first electroluminescent layer, the second electroluminescent layer, and the third electroluminescent layer includes a plurality of electroluminescent material blocks for displaying respective colors. Each of the plurality of electroluminescent material blocks corresponds to one corresponding opening of a certain mask plate for fabricating a corresponding electroluminescent layer.

In one possible embodiment, fabricating respective electroluminescent layer patterns by using respective mask plates includes fabricating respective electroluminescent layer patterns by an evaporation process.

In a third aspect, embodiments of the present disclosure provide a method for fabricating a display panel including steps of fabricating respective electroluminescent layers by using any one of the above methods for fabricating the same.

In one possible embodiment, the method further includes a step of fabricating a pixel electrode that includes a plurality of pixel electrode blocks. Each of electroluminescent material blocks included in the first electroluminescent layer and the second electroluminescent layer corresponds to two columns of pixel electrode block, and each of electroluminescent material blocks included in the third electroluminescent layer corresponds to one column of pixel electrode block.

In one possible embodiment, within the mask plate assembly used by the method for fabricating the display panel component, the first openings and the second openings are aligned with one another in the column direction and arranged alternately. And each of electroluminescent material blocks included in the first electroluminescent layer pattern and the second electroluminescent layer pattern corresponds to two rows and two columns of pixel electrode block.

In a fourth aspect, embodiments of the present disclosure provide an Organic Light-Emitting Diode (OLED) display panel including a sub-pixel array having three-color sub-pixels. Each row of the sub-pixel array includes the three-color sub-pixels arranged alternately in an order of a first color sub-pixel, another first color sub-pixel, a third color sub-pixel, a second color sub-pixel, another second color sub-pixel, and another third color sub-pixel.

In one possible embodiment, each column of the sub-pixel array includes the three-color sub-pixels arranged alternately in an order of a first color sub-pixel, another first color sub-pixel, a second color sub-pixel, and another second color sub-pixel.

In a fifth aspect, embodiments of the present disclosure provide a method for driving the OLED display panel which is applied to any one of the above display panels. The method includes dividing respective sub-pixels within the sub-pixel array into a plurality of pixel units for display driving.

In one possible embodiment, the plurality of pixel units includes a first color sub-pixel, a second color sub-pixel immediately adjacent to the first color sub-pixel in a column direction, and a third color sub-pixel immediately adjacent to the first color sub-pixel or the second color sub-pixel in a row direction.

In one possible embodiment, the plurality of pixel units includes a first color sub-pixel, a second color sub-pixel, and a third color sub-pixel arranged between the first color sub-pixel and the second color sub-pixel.

In a sixth aspect, embodiments of the present disclosure provide a display device including any one the above display panels.

According to the mask plate assembly provided by the disclosure, in comparison between the first mask plate and the second mask plate included in the mask plate assembly according to the disclosure and mask plates in the related arts, in a situation where sub-pixels are made to have a same width, a width of openings of both the first and second color mask plates as well as that of grids between the corresponding openings can be doubled, which can effectively prevent deforms at openings and grids therebetween from imposing bad influence on its performance, such that adverse effect on a shape of sub-pixels to be fabricated can be prevented as well.

DETAILED DESCRIPTION

In order to make the technical solutions and the advantages of the disclosure more apparent, the disclosure will be described hereinafter in a clear and complete manner in conjunction with the drawings and embodiments. Obviously, the following embodiments are merely a part of, rather than all of, the embodiments of the present disclosure. And based on these embodiments, a person skilled in the art may obtain the other embodiments, which also fall within the scope of the present disclosure. Obviously, the following drawings merely relate to some embodiments of the present disclosure, and based on these drawings, a person skilled in the art may obtain the other drawings without any creative effort.

It should be indicated herein, embodiments of the disclosure are described only with an electroluminescent layer as an example, which cannot be construed as any limitations on the disclosure. Further, the disclosure is not limited only to an Organic Light-Emitting Diode (OLED) display field, but also includes other display fields such as Liquid Crystal Display (LCD). The layers fabricated by using mask plates are not limited only to the electroluminescent layers, but also include other kinds of layers. A shape of openings of the mask plates is not limited only to a rectangular shape. However, the following description relates to openings of the mask plates having a rectangular shape as an example.

In any one of embodiments of the disclosure, at least one of three mask plates included in the mask plate assembly is a metal mask plate.

First Embodiment

Figure 2:
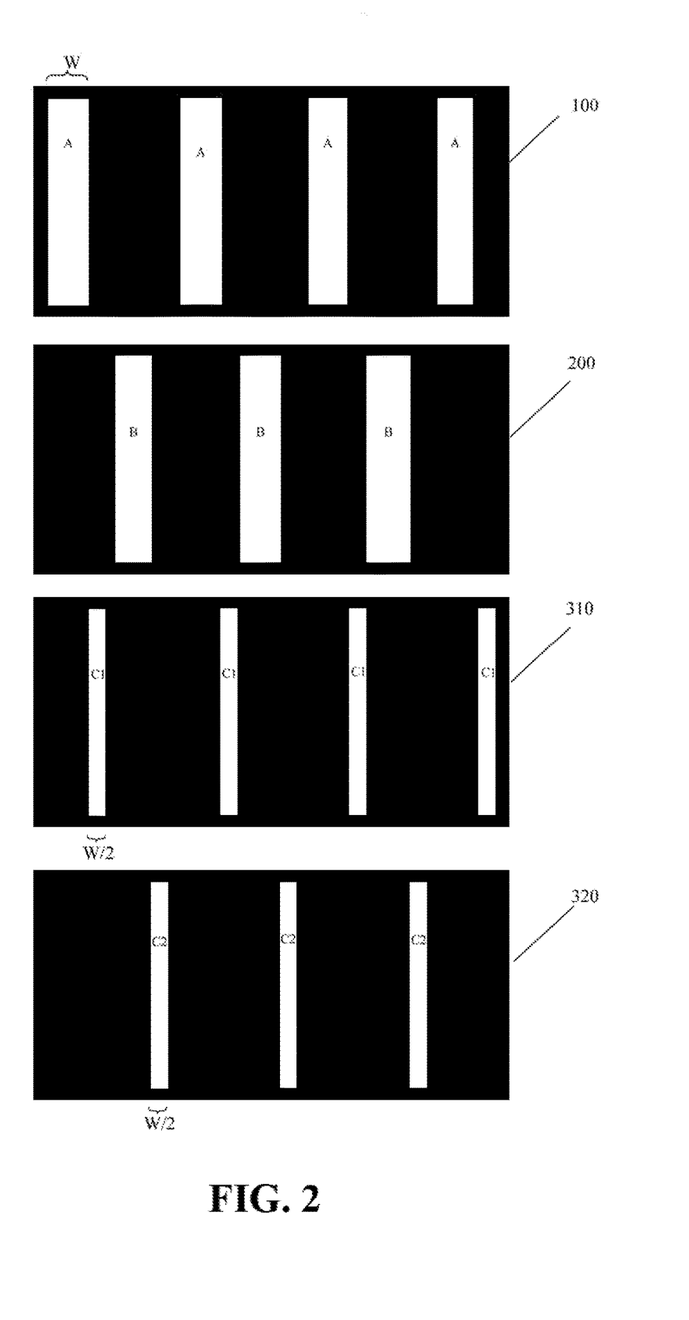
FIG. 2 is a schematic diagram illustrating a structure of a mask plate assembly according to a first embodiment of the disclosure.

FIG. 2 is a schematic diagram illustrating a structure of a mask plate assembly according to the first embodiment of the disclosure. As shown in FIG. 2, the mask plate assembly includes a mask plate 100, a mask plate 200, a mask plate 310, and a mask plate 320. Each of the above mask plates includes a non-masking region and a masking region. Here the masking region is referred to as a region corresponding to a display region of a display panel to be fabricated, while the non-masking region is referred to as peripheral regions enclosing the masking region. Specifically, the masking region includes rectangular openings extended in a column direction and grids located between corresponding openings and used for defining rectangular openings. Further, a length of the rectangular openings is substantially the same as that of the masking region in the column direction.

Rectangular openings A of the mask plate 100 and rectangular openings B of the mask plate 200 are of a width of W (in a row direction), while rectangular openings C1 of the mask plate 310 and rectangular openings C2 of the mask plate 320 are of a width of W/2. As shown in FIG. 2, when the mask plate 100, the mask plate 200, the mask plate 310, and the mask plate 320 are aligned with one another, the rectangular openings A, B, C1, and C2 are arranged alternately in the row direction in an order of a rectangular opening A, a rectangular opening C1, a rectangular opening B, and a rectangular opening C2. Both the rectangular openings C1 and C2 are arranged respectively at regions between one rectangular opening A and each of two rectangular openings B immediately adjacent to the one rectangular opening A.

In one possible embodiment, respective electroluminescent layers of an Organic Light-Emitting Diode (OLED) display panel are fabricated by using the mask plate assembly provided by the first embodiment of the disclosure. The method for fabricating respective electroluminescent layers may include: fabricating a first electroluminescent layer pattern for displaying a first color (e.g., red (R)) by using the mask plate 100; fabricating a second electroluminescent layer pattern for displaying a second color (e.g., blue (B)) by using the mask plate 200; fabricating a third electroluminescent layer pattern for displaying a third color (e.g., green (G)) by using the mask plate 310 and the mask plate 320.

Figure 3:
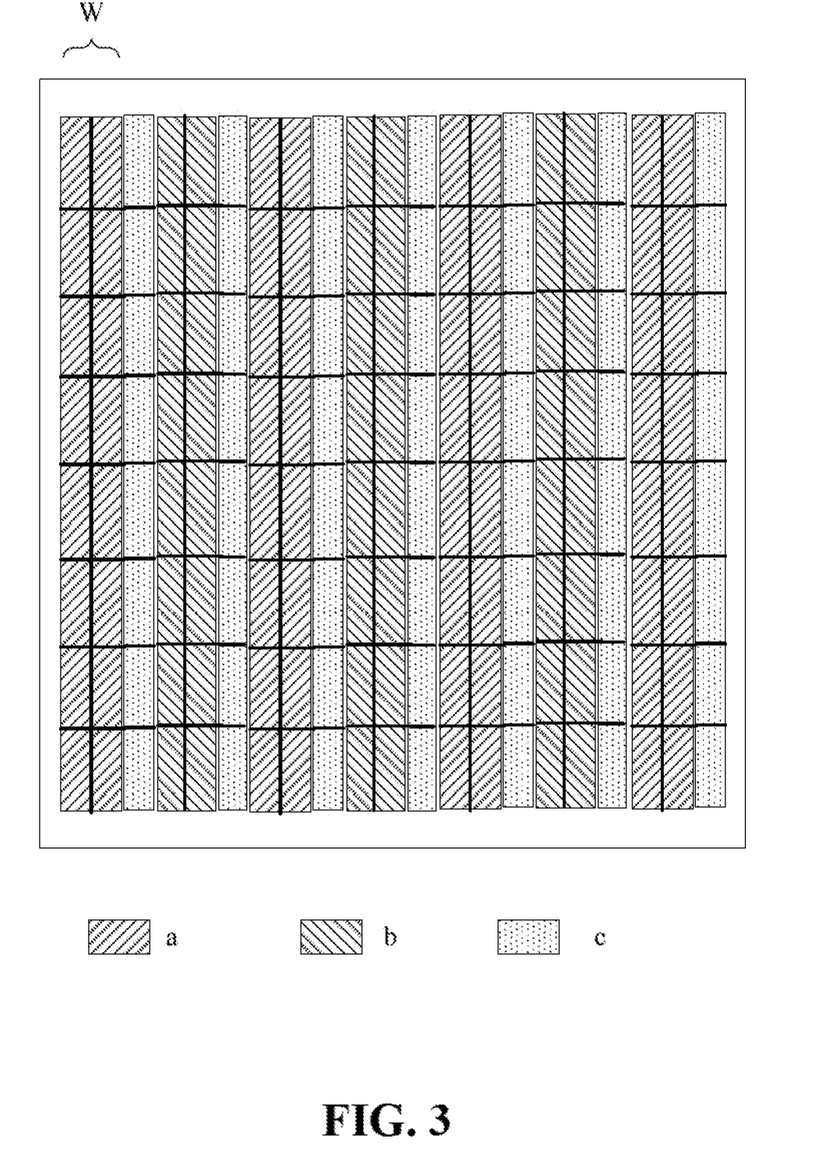
FIG. 3 is a schematic diagram illustrating respective electroluminescent layers by using the mask plate assembly according to the first embodiment of the disclosure.

Respective electroluminescent layers fabricated by using the above mask plate assembly are shown in FIG. 3. The respective electroluminescent layers include a first electroluminescent layer pattern for displaying the first color (which consists of electroluminescent material blocks "a" each having a strip-like shape as shown in FIG. 3), a second electroluminescent layer pattern for displaying the second color (which consists of electroluminescent material blocks "b" each having a strip-like shape as shown in FIG. 3), and a third electroluminescent layer pattern for displaying the third color (which consists of electroluminescent material blocks "c" each having a strip-like shape as shown in FIG. 3). Therefore, in the row direction, the electroluminescent material blocks "a", the electroluminescent material blocks "b", and the electroluminescent material blocks "c" are arranged alternately in an order of an electroluminescent material block "a", an electroluminescent material block "c", an electroluminescent material block "b", and another electroluminescent material block "c".

In one possible embodiment, a process of fabricating electroluminescent layer patterns is referred to as forming organic electroluminescent materials on a corresponding base substrate by an evaporation process using respective mask plates.

Referring to FIG. 3, in a possible embodiment, each of electroluminescent material blocks may be divided into many rows of sub-pixels. Specifically, each of the electroluminescent material blocks "a" is divided into two columns of first color sub-pixels, each of the electroluminescent material blocks "b" is divided into two columns of second color sub-pixels, and each of the electroluminescent material blocks "c" corresponds to one column of third color sub-pixels. As a result, each of the third color sub-pixels is of a width of W/2. In doing so, when display driving is conducted, one third color sub-pixel as well as one first color sub-pixel and one second color sub-pixel adjacent to the one third color sub-pixel are taken as one pixel unit for displaying. By comparison with FIG. 1, in a situation where sub-pixels to be fabricated are of a same width, an opening width and a grid width of the mask plates 100, 200 included in the mask plate assembly according to embodiments of the disclosure are twice as wide as those of the mask plates 100, 200 included in the mask plate assembly according to the related arts. Put it another way, in the mask plates according to the related arts, with respect to the mask plate 100 or 200, a distance between any two openings, i.e., a width of one grid, is twice as wide as that of one sub-pixel. As opposed to it, according to embodiments of the disclosure, with respect to the mask plate 100 or 200, a distance between two rectangular openings A or B is four times as wide as that of one sub-pixel. As a result, a grid width of the mask plate 100 or 200 doubles in relation to its original width, which can effectively prevent grids and openings from deforms. In other words, provided that there is a constant thickness, the wider grids and openings are, the more likely strain forces on them decentralize, and the harder for them to experience deforms.

In one possible embodiment, the method for fabricating an OLED display panel usually further includes a step of patterning a pixel electrode. Respective electroluminescent material blocks are divided into a plurality of sub-pixels by such a step of patterning the pixel electrode, according to this disclosure. Specifically, by choosing suitable fabricating processes, the pixel electrode pattern includes a plurality of pixel electrode blocks. That is to say, the electroluminescent material blocks "a" and the electroluminescent material blocks "b" correspond to N rows and two columns of pixel electrode blocks within the pixel electrode pattern to be fabricated, where N represents a number of sub-pixels within one column of sub-pixels of the OLED display panel to be fabricated. On the other hand, each of the electroluminescent material blocks "c" corresponds to N rows and one column of pixel electrode blocks within the pixel electrode pattern to be fabricated.

It should be appreciated that the pixel electrode block within the pixel electrode pattern is referred to as an electrode that is connected with a pixel driver and used for display control.

In the first embodiment of the disclosure, the mask plates 310 and 320 are in combination to form a third color mask plate used for fabricating sub-pixels for displaying the third color. As compared with FIG. 1, in embodiments of the disclosure, in a situation where sub-pixels to be fabricated are of a same width, a grid width of the mask plates 310 and 320 becomes 5/2 times as wide as its original width, thereby effectively preventing grids and openings from deforms. In the related art, the distance between two adjacent opening, i.e., the width of a grid, is twice as wide as a width of a sub-pixel. Specifically, in embodiments of the disclosure, with respect to the mask plate 310, there arranged one rectangular opening A, one rectangular opening B, and one rectangular opening C2 between two immediately adjacent rectangular openings C1. As a result, a width of a corresponding grid is five times as wide as that of a sub-pixel. Alike, with respect to the mask plate 320, a width of a corresponding grid is also five times as wide as that of a sub-pixel. Accordingly, a grid width of the mask plates 310 and 320 becomes 5/2 times as wide as its original width.

Second Embodiment

Figure 4:
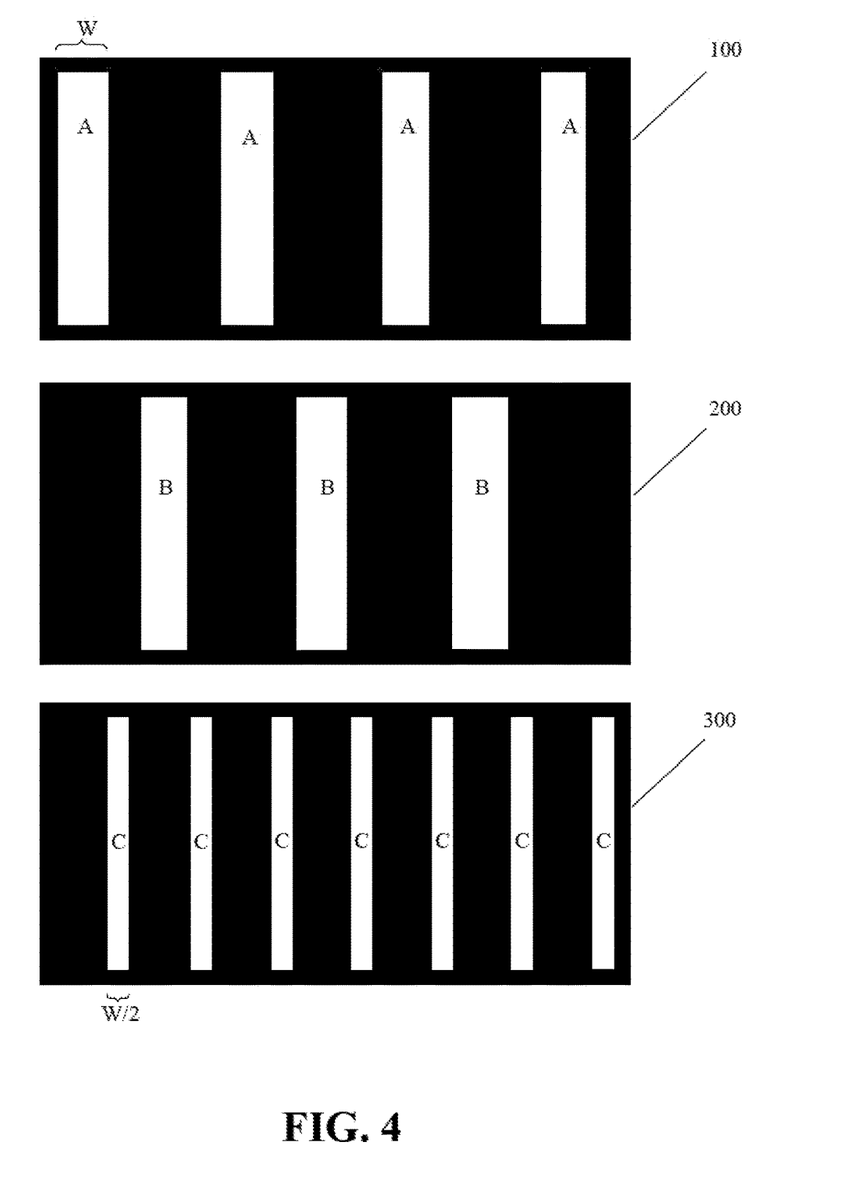
FIG. 4 is a schematic diagram illustrating a structure of another mask plate assembly according to a second embodiment of the disclosure.

As different from the first embodiment, in the second embodiment, the mask plates 310 and 320 are replaced with one mask plate 300 having a plurality of rectangular openings C as shown in FIG. 4. When the mask plates 100, 200, and 300 are aligned with one another, in a row direction, the rectangular openings A, B, and C are arranged alternately in an order of a rectangular opening A, a rectangular opening C, a rectangular opening B, and another rectangular opening C.

The method for fabricating respective electroluminescent layers by using the mask plate assembly provided by the second embodiment may refer to that described in the first embodiment. The difference is that only one mask plate 300, other than two mask plates, is used for fabricating sub-pixels for displaying the third color.

The respective electroluminescent layers fabricated by using the mask plate assembly provided by the second embodiment may refer to FIG. 3, which will not be described in details.

The mask plate assembly provided by the second embodiment can reduce the number of mask plates to be used, by comparing with that of the first embodiment.

Third Embodiment

Figure 5:
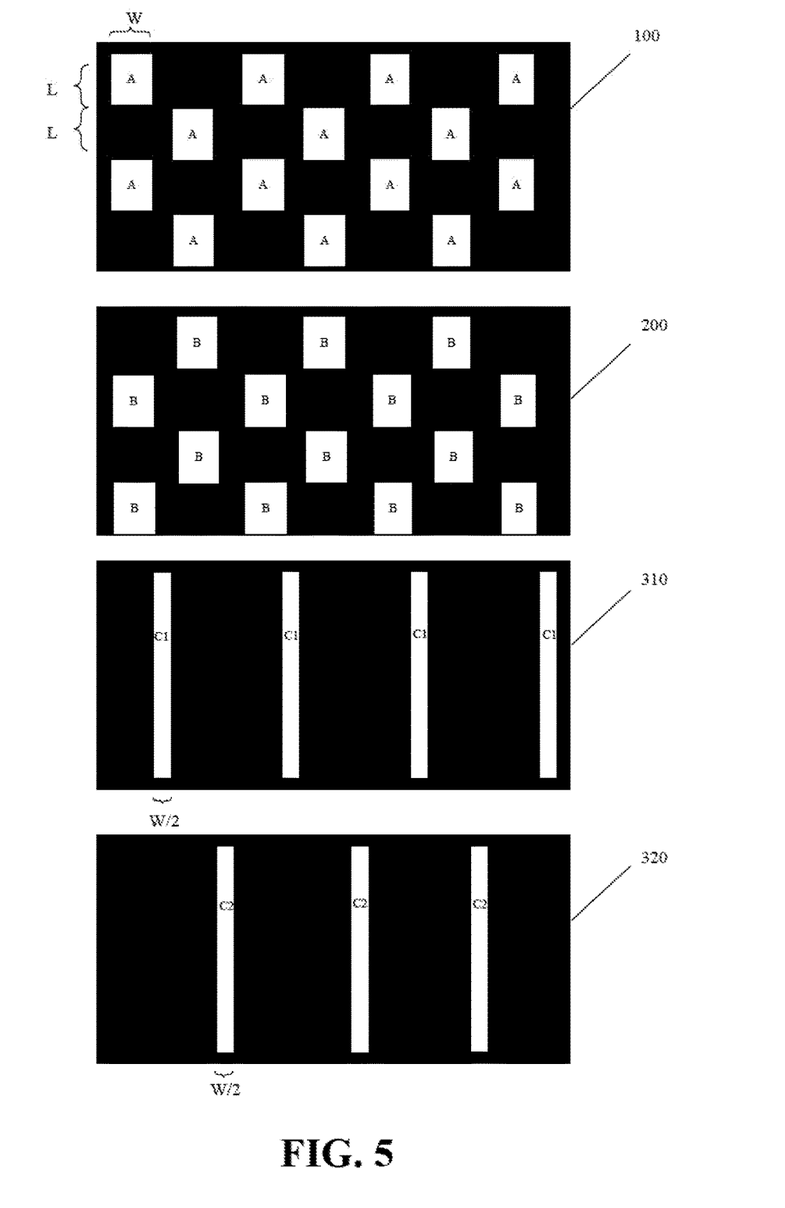
FIG. 5 is a schematic diagram illustrating a structure of yet another mask plate assembly according to a third embodiment of the disclosure.

As shown in FIG. 5, in the third embodiment, rectangular openings A of the mask plate 100 and rectangular openings B of the mask plate 200 are of a relatively smaller length, which is different from the first embodiment. When a plurality of rectangular openings A and a plurality of rectangular openings B are aligned in a column direction, then these openings A and B are arranged alternately. On the other hand, when the plurality of rectangular openings A and the plurality of rectangular openings B are aligned in a row direction, these openings A and B are also arranged alternately. Moreover, as in the first embodiment, both rectangular openings A and rectangular openings B are of a width twice as wide as that of rectangular openings C1 and C2. Further, single rectangular opening A and single rectangular opening B are of a same length in the column direction, which is taken as L.

By comparing with the mask plates 100 and 200 in the related arts, grids of the mask plates 100 and 200 in the third embodiment are in a form of a lattice-like structure, which can effectively prevent openings and grids of the mask plates 100 and 200 from deforms.

Figure 6:
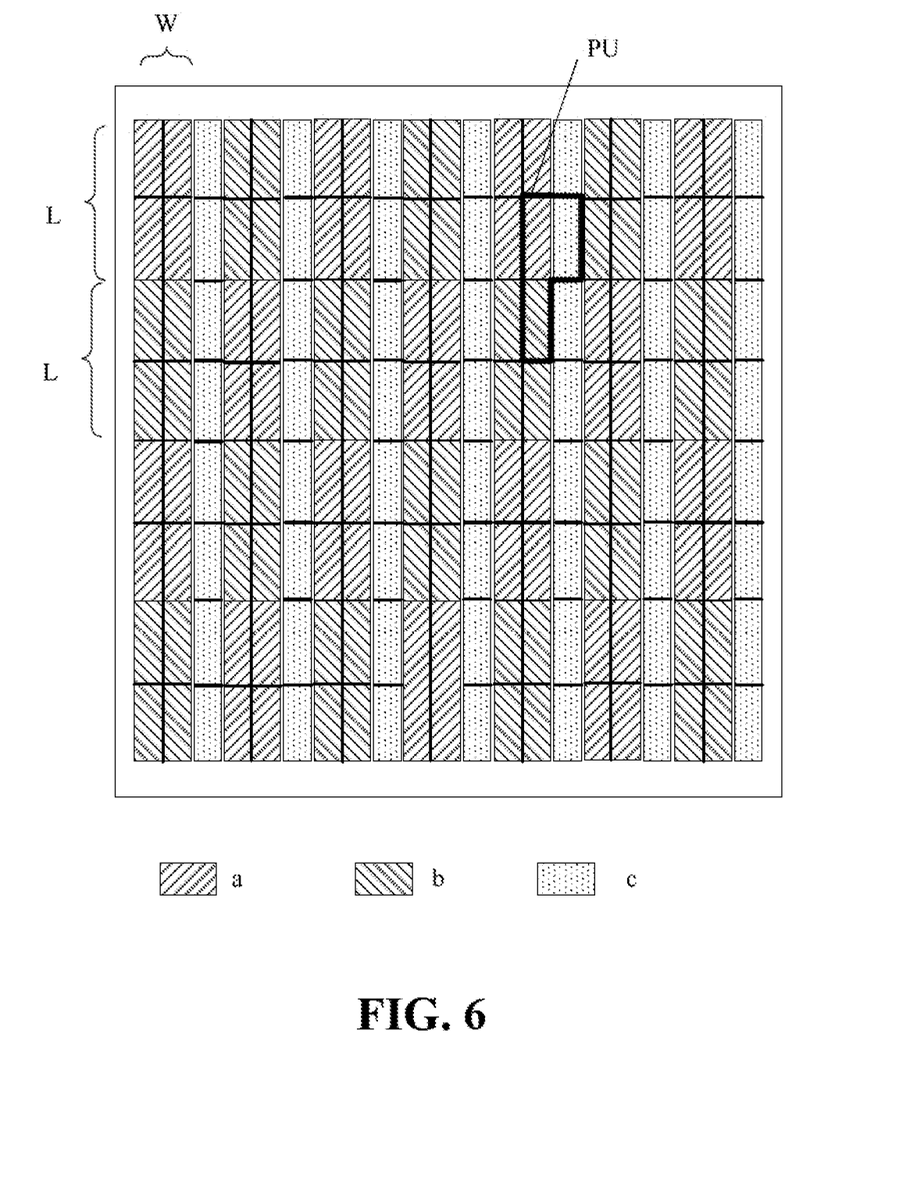
FIG. 6 is a schematic diagram illustrating respective electroluminescent layers by using the mask plate assembly according to the third embodiment of the disclosure.

Respective electroluminescent layers as shown in FIG. 6 are fabricated by using the mask plate assembly according to the third embodiment. Specifically, the electroluminescent material block "a" formed by one rectangular opening A is divided into two rows and two columns of four sub-pixels for displaying a first color. The electroluminescent material block "b" formed by one rectangular opening B is divided into two rows and two columns of four sub-pixels for displaying a second color. And the electroluminescent material block "c" formed by rectangular openings C1 and C2 is divided into N rows and one column (N represents a resolution in the column direction) of sub-pixels for displaying a third color. As a result, one sub-pixel is of a width of W/2 and a length of L/2.

Accordingly, in the method for fabricating the OLED display device, with respect to the pixel electrode pattern to be fabricated, the electroluminescent material block "a" formed by one rectangular opening A and the electroluminescent material block "b" formed by one rectangular opening B both correspond to two rows and two columns of sub-pixel electrode blocks.

In one possible embodiment, the sub-pixel array as shown in FIG. 6 may be driven by the display driving method according to the first embodiment. In other words, one pixel unit PU that includes one third color sub-pixel, and one first color sub-pixel and one second color sub-pixel immediately adjacent to the one third color sub-pixel is driven for displaying. Alternatively, in another possible embodiment, another display driving method may be performed, as shown in FIG. 6. Specifically, according to this method, one pixel unit PU that includes one first color sub-pixel, one second color sub-pixel immediately adjacent to the one first color sub-pixel in the column direction, and one third color sub-pixel immediately adjacent to the one first color sub-pixel or the one second color sub-pixel in the column direction is driven for displaying. The display driving method as shown in FIG. 6 enables display pictures to look more subtle, compared with conventional display driving methods.

In another aspect of the disclosure, an OLED display panel and a display device including the same are provided. The OLED display panel includes a sub-pixel array having sub-pixels for displaying three different colors. A specific arrangement of the sub-pixel array may refer to FIG. 3 or FIG. 6. Within one row of sub-pixels, these sub-pixels for displaying different colors are arranged alternately in an order of a first color sub-pixel, another first color sub-pixel, a third color sub-pixel, a second color sub-pixel, another second color sub-pixel, and another third color sub-pixel.

Further, as shown in FIG. 6, in the above sub-pixel array, each sub-pixel column to which respective first color sub-pixels belong and each sub-pixel column to which respective second color sub-pixels belong include only the first color sub-pixels and the second color sub-pixels. In addition, these first color sub-pixels and these second color sub-pixels are arranged alternately in an order of a first color sub-pixel, another first color sub-pixel, a second color sub-pixel, and another second color sub-pixel.

Specifically, the above display device may be any devices having displaying function, such as a mobile phone, a desktop computer, a TV, a laptop computer, and so forth.

In addition, it should be appreciated that the above terms "row" and "column" only indicate two directions perpendicular to each other. There is no intention that "row" is only limited to a lateral direction, while "column" is only limited to a longitudinal direction.

The above are merely example embodiments of the disclosure and shall not be used to limit the scope of the disclosure. It should be noted that, a person skilled in the art may make improvements and modifications without departing from the principle of the disclosure, and these improvements and modifications shall also fall within the scope of the disclosure.

What is claimed is:

1. A mask plate assembly comprising:
   a first mask plate having a plurality of first openings;
   a second mask plate having a plurality of openings; and
   a third mask plate having a plurality of third openings,
      wherein the first openings and the second openings have a same length in a row direction, which is twice a length of the third openings in the row direction, and
      wherein when the first mask plate, the second mask plate, and the third mask plate are aligned with one another, the first openings, the second openings, and the third openings, wherein the openings are arranged alternately, in the row direction in an order of a first opening, a third opening, a second opening, and another third opening.

2. The mask plate assembly according to claim 1, wherein the first openings and the second openings are of a same length in a column direction, and wherein the first openings and the second openings are aligned with one another in the column direction and arranged alternately.

3. The mask plate assembly according to claim 1, wherein the third mask plate includes a first sub-mask plate having a plurality of the third openings and a second sub-mask plate having a plurality of the third openings, and wherein when the first sub-mask plate and the second sub-mask plate are aligned with one another, the third openings of the first sub-mask plate and the third openings of the second sub-mask plate are arranged alternately in the row direction.

4. The mask plate assembly according to claim 1, wherein the first openings, the second openings, and the third openings all have a rectangular shape, and wherein at least one of the first mask plate, the second mask plate, and the third mask plate is a metal mask plate.

5. A method for fabricating a display panel component by using the mask plate assembly according to claim 1 comprising:
   fabricating a first layer using the first mask plate;
   fabricating a second layer using the second mask plate; and
   fabricating a third layer using the third mask plate.

6. The method according to claim 5, wherein the first layer is a first electroluminescent layer for displaying a first color, the second layer is a second electroluminescent layer for displaying a second color, and the third layer is a third electroluminescent layer for displaying a third color.

7. The method according to claim 6, wherein each of the first electroluminescent layer, the second electroluminescent layer, and the third electroluminescent layer includes a plurality of electroluminescent material blocks configured to display respective colors, and wherein each of, the plurality of electroluminescent material blocks corresponds to one corresponding opening of a mask plate configured to fabricate a corresponding electroluminescent layer.

8. The method according to claim 7, wherein fabricating respective electroluminescent layer patterns using respective mask plates comprises fabricating respective electroluminescent layer patterns using an evaporation process.

9. A method for fabricating a display panel comprising fabricating respective electroluminescent layers using the method according to claim 5.

10. The method according to claim 9, wherein the display panel is an Organic Light-Emitting Diode (OLED) display panel, wherein the method further comprises fabricating a pixel electrode that includes a plurality of pixel electrode blocks, wherein each electroluminescent material block included in the first electroluminescent layer and the second electroluminescent layer corresponds to two columns of pixel electrode blocks, and wherein each electroluminescent material block included in the third electroluminescent layer corresponds to one column of pixel electrode blocks.

11. The method according to claim 9, wherein the respective electroluminescent layers are fabricated using the mask plate assembly, wherein the first openings and the second openings have a same length in a column direction, wherein the first openings and the second openings are aligned with one another in the column direction and arranged alternately, and wherein each electroluminescent material block included in the first electroluminescent layer and the second electroluminescent layer corresponds to two rows and two columns of pixel electrode blocks.

* * * * *